(12) United States Patent
Takagi et al.

(10) Patent No.: US 6,888,857 B2
(45) Date of Patent: May 3, 2005

(54) OPTICAL MODULE (75) Inventors: Toshio Takagi, Kanagawa (JP);
Takashi Kato, Kanagawa (JP); Jiro
Shinkai, Kanagawa (JP); Hiroyuki
Yabe, Kanagawa (JP)

(73) Assignee: Sumitomo Electric Industries, Ltd.,
Osaka (JP)

( * ) Notice: Subject to any disclaimer, the term of this
patent is extended or adjusted under 35
U.S.C. 154(b) by 207 days.

(21) Appl. No.: 10/247,817

(22) Filed: Sep. 20, 2002

(65) Prior Publication Data

US 2003/0063635 A1 Apr. 3, 2003

(30) Foreign Application Priority Data

Sep. 21, 2001 (JP) ........................................ 2001-289525
Sep. 21, 2001 (JP) ........................................ 2001-289536

(51) Int. Cl.[7] .............................. H01S 3/13; G02B 6/36
(52) U.S. Cl. .............................. 372/32; 385/89; 385/92;
372/29.02; 372/34; 372/38.1
(58) Field of Search ........................ 385/33–36, 88–94;
372/29.021, 32, 34, 38.1, 38.01, 38.02

(56) References Cited

U.S. PATENT DOCUMENTS

| 5,825,792 | A | | 10/1998 | Villeneuve et al. |
| 6,488,419 | B2 | * | 12/2002 | Kato et al. ..................... 385/93 |
| 2002/0018627 | A1 | | 2/2002 | Kato et al. |
| 2003/0108072 | A1 | * | 6/2003 | Hedin .......................... 372/32 |

* cited by examiner

*Primary Examiner*—Brian Healy
*Assistant Examiner*—Kevin S. Wood
(74) *Attorney, Agent, or Firm*—Smith, Gambrell & Russell, LLP (57) ABSTRACT

The light-emitting module includes a semiconductor light-emitting device, a first optical detector for monitoring the magnitude of light emitted from the semiconductor device, a second optical detector for monitoring an oscillation wavelength of the semiconductor device, and an Etalon. The first detector is located in a position where the wavelength variation of the transmitted light from the Etalon is relatively small, while the second detector is located in a position where the wavelength variation of the transmitted light is relatively large. The geometrical size of the second detector along the first direction is wider than that along the second direction normal to the first direction; this thus enhances the efficiency of wavelength sensitivity.

18 Claims, 11 Drawing Sheets

OPTICAL MODULE

CROSS REFERENCE RELATED APPLICATIONS

This application contains subject matter that is related to the subject matter of the following application, which is assigned to the same assignee as this application and filed on the same day as this application. The below listed application is hereby incorporated herein by reference in its entirely:

"Light-Emitting Module" by Yabe et. al.
"Optical Module" by Shinkai et. al

BACKGROUND OF THE INVENTION

1. Field of the Invention

This invention relates to an light-emitting module.

2. Background of the Invention

The WDM (Wavelength Divisional Multiplexing) system at 1.55 um wavelength band defines the adjacent wavelength interval to be 0.8 nm. This regulation means that the absolute accuracy more than ±0.1 nm is required for a specific channel. A semiconductor laser with a feedback control, such as DFB laser (Distributed Feedback Laser) and DBR laser (Distributed Bragg Reflector) is applicable for the signal source of the WDM system.

These feedback lasers show a sharp oscillation spectrum with a typical oscillation width below 50 GHz. However, the Bragg grating formed within a laser chip solely determines the oscillation wavelength. To get the desired oscillation wavelength is quite difficult due to the uncertainty of the process parameter.

It is known that the oscillation wavelength of individual lasers can be adjusted by the feedback control after the completion of the production. 1) Dividing the output light from the optical module, 2) monitoring the divided light with a spectrum analyzer, and 3) adjusting the temperature of the laser and the injection current to the laser controls the oscillation wavelength. However, this technique uses the optical spectrum analyzer and is quite impossible to apply to the WDM system, which requires the multi channel optical signal source, hence a plurality set of equipment.

Another example is disclosed in U.S. Pat. No. 5,825,792, in which the parallel plates Etalon is used for the controlling of the oscillation wavelength. The method of the '792 controls the oscillation wavelength with high accuracy, but to control the optical output power requires a complicated circuit.

SUMMARY OF THE INVENTION

The object of the present invention is to provide an optical module that enables to control both of the oscillation wavelength and the optical output power with high accuracy within a compact sized housing.

An optical module according to the present invention has a semiconductor light-emitting device, an Etalon device, and two optical detectors. One of detectors detects a magnitude of an optical output power of the semiconductor device, and the other detector detects an output wavelength of the semiconductor device. The Etalon device may be a wedge typed-Etalon. Light entering the Etalon may be a collimated light. The magnitude passing the Etalon, which is equivalent to the transmittance T of the Etalon, depends on a thickness d of the Etalon and a wavelength of light λ. Namely, the behavior of the transmittance shows a periodicity with a period of n·d/λ, where n is a refractive index of the Etalon. In the case of the wedge Etalon device, since the thickness d of the Etalon varies as the position x, the transmittance of the Etalon is a function of the wavelength λ and the position x.

In the present invention, the first detector locates the position where the variation of the transmittance of the Etalon is relatively small to the wavelength, and the second detector locates the position where the variation of the transmittance of the Etalon is relatively large to the wavelength variation. In this configuration, the position of the first detector corresponds to the position where the ∂T/∂x is small, and the position of the second detector corresponds to the position where ∂T/∂x is large.

Further, the geometrical size of the second detector along the x direction is preferable to be smaller than a quarter of the period of the periodicity of the transmittance to effectively detect the wavelength variation of light from the semiconductor device. It is further preferable to set a third detector in a position apart from the first detector by a half period of the periodicity of the transmittance. By adding the output from the third detector to the output of the first detector, the variation of the output from the third detector compensates the variation of the output from the first detector.

Another aspect of the present invention sets the width of the first detector along the x direction to be multiple integers of a half period of the periodicity of the transmittance. By this configuration, the variation of the optical output from the first detector is significantly suppressed. Moreover, the geometrical size of the second detector along a direction normal to the x may be expanded, which compensates the decrease of the output from the second detector by narrowing the width along the x direction for enhancing the wavelength sensitivity.

DETAILED DESCRIPTION OF THE INVENTION

The preferred embodiments of the optical module will be described in referring to drawings. In the description, elements identical to each other will be referred to with numerals identical to each other without their overlapping explanations.

Figure 1:
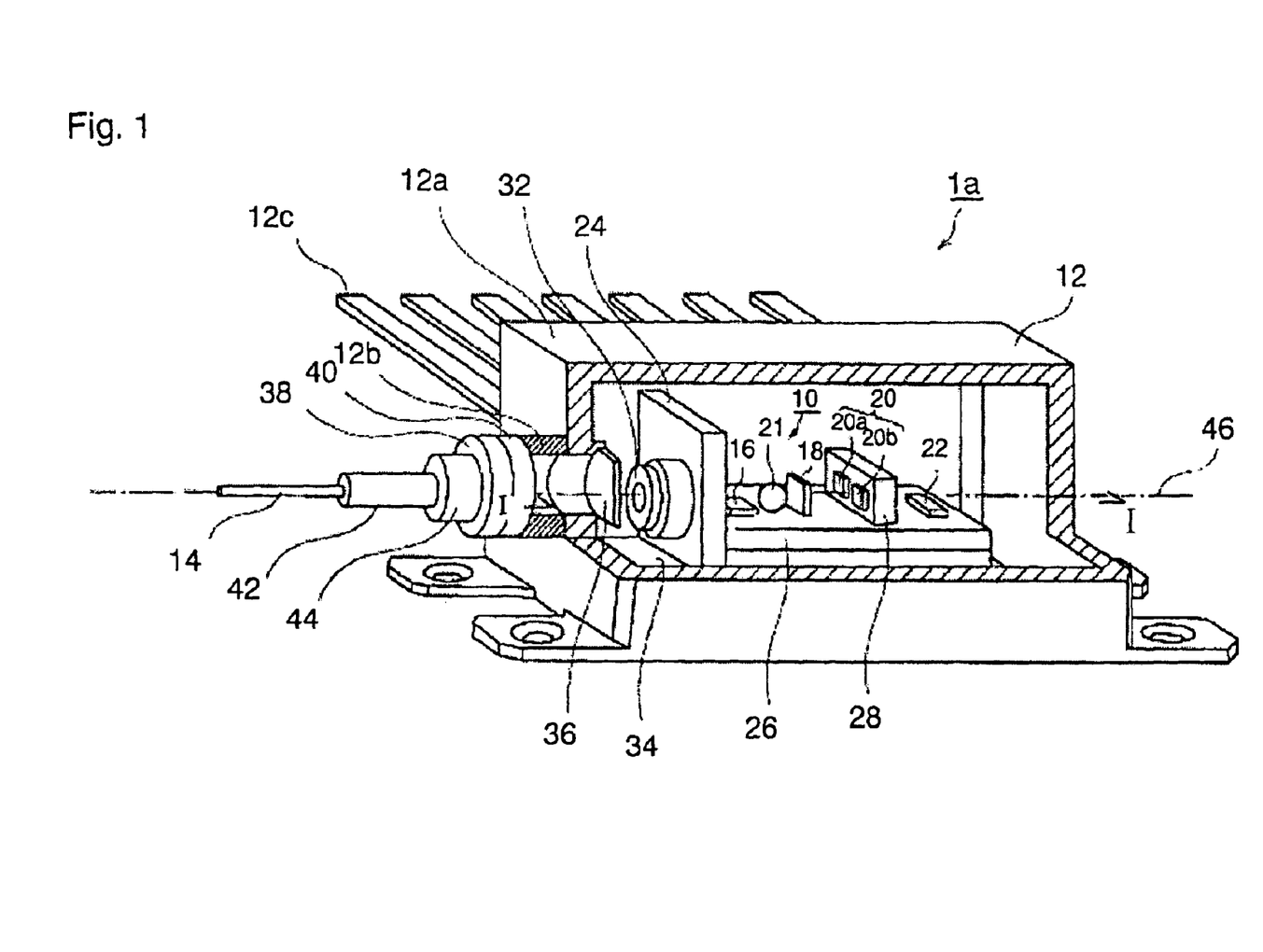
FIG. 1 is a perspective view showing the optical module, a portion of which is broken to describe the inside of the module.
Figure 2:
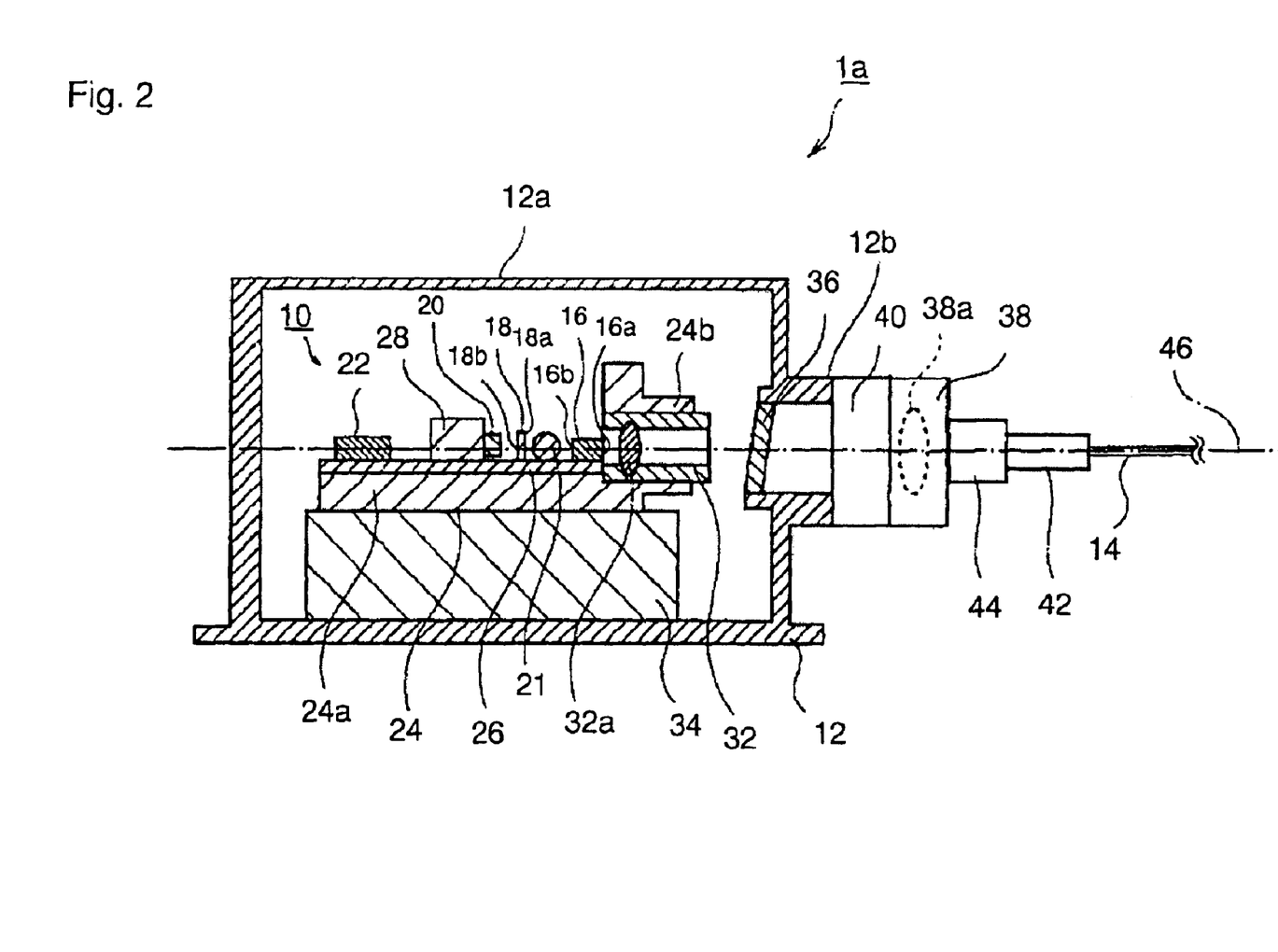
FIG. 2 shows a cross sectional view along the I—I line in FIG. 1.

A semiconductor laser module 1a according to the present invention comprises a primary assembly 10 and housing 12. FIG. 1 is a view showing a semiconductor laser module 1a of the present invention and FIG. 2 is a cross sectional view of the module. The housing 12 forms a butterfly package. The package 12 arranges the primary assembly 10 therein and seals with an inert ambient, such as dry nitrogen. The housing 12 comprises a body 12a, a cylinder 12b, and a plurality of leads 12c. The primary assembly 10 has a semiconductor laser 16, auxiliary members (24, 26, 28) and a lens holder 32. The auxiliary member 24 places the member 26 thereon, and the member 26 carries the member 28. The auxiliary member 26 mounts the laser 16, light-receiving device 20, a wedge Etalon 18, a lens 21 and an electronic circuit device 22. The member 24 is mounted on a thermoelectric cooler 34, such as a Peltier Element. The thermoelectric cooler controls a temperature of the laser 16 thorough the auxiliary members (24, 26). It is preferable for members to be made of material with good thermal conductivity. Aluminum Nitride (AlN) is one of the best materials for the auxiliary members.

An opening for coupling the primary assembly 10 to the cylinder 12b is provided on one wall of the housing 12. A window 36 made of a hermetic glass seals the opening. Light emitted from the laser 16 passes through the opening and enters one tip of an optical fiber 14. Another lens holder 38 is provided at the edge of the cylinder 12b. An optical isolator 40 that cuts the light propagating from the optical fiber 14 to the laser 16 is placed between the lens holder 38 and the window 36.

The optical fiber 14 is inserted into the edge of the cylinder 12b. A ferrule 42 covers the tips of the fiber 14. The lens holder 38 holds a sleeve 44. Inserting the ferrule 42 into the sleeve 44, the optical position of the ferrule to the housing 12 is defined. Thus, the fiber 14, the lens holder 38 and the primary assembly 10 are optically aligned to each other.

Referring to FIG. 2, the auxiliary member 24 comprises a device-mounting portion 24a and a lens-supporting portion 24b. The lens-supporting portion 24b provides an opening to secure the lens holder 32 for holding a lens 32a. The lens collimates the light emitted from the laser 16. To slide the position of the lens holder 32 in the opening enables to adjust an interval between the laser 16 and the lens 32a.

The laser 16 comprises a first facet 16a, a second facet 16b, and an active layer (a light-emitting layer) provided between the first and the second facet. The laser is placed on the auxiliary member 26. A pair of facet 16a and 16b of the laser forms an optical cavity. Since the reflectivity of the first facet 16a is lower than that of the second facet 16b, it enables to take out the light through the first facet 16a. The first facet 16a couples to the optical fiber 14 through two lenses (32a, 38a). It is preferable to use the DFB (Distributed Feedback Laser) laser 16. However, a Fabry-Perott type laser is also applicable. On the first facet 16a of the laser provides an anti-reflection coating, while a high-reflection coating is preferred to be on the second facet 16b of the laser. A SiN (Silicon Nitride) and amorphous a-Si are typically used as the coating material.

The electronic circuit device includes a temperature controlling circuit for thermoelectric cooler 34 and a driving circuit for the laser 16. The temperature controlling circuit receives a signal from the light detector 20b and output the driving signal for the cooler 34, thus, adjust the oscillation wavelength of the laser 16 that depends on the temperature. The laser driving circuit receives a signal from the detector 20a and output the driving current for the laser. The electronic circuit device may be placed out of the housing 12 separately from the module 1a. The leads 12c of the housing 12 passes the signal output from the detector 20a and 20b, or the signal for driving the cooler 34 and the laser diode 16.

An Etalon device 18 is placed on the auxiliary member 26. One surface 18a of the Etalon is optically coupled to the facet 16b of the laser, while the other surface 18b of the Etalon is coupled to the light-receiving device 20, which contains a first light detector 20a and a second light detector 20b.

Figure 3:
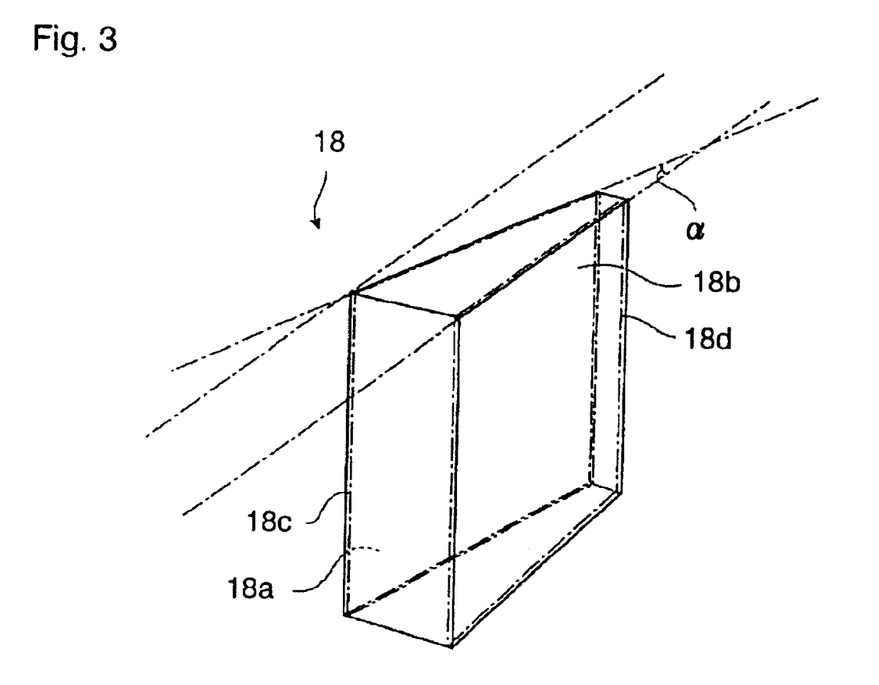
FIG. 3 is a view showing the Etalon device.

As shown in FIG. 3, the Etalon has a pair of surface (18a, 18b), each make a slight angle $\alpha$. The angle $\alpha$ is determined by the condition that the incident light to the surface 18a may interfere with the light reflected at the other surface 18b. It is preferable for the angle $\alpha$ greater than $0.01°$ and smaller than $0.1°$. Etalon shown in FIG. 3 is wedge typed Etalon and has reflection films 18c and 18d with multi-layered structure on surfaces 18a and 18b, respectively. The reflectivity of respective surfaces 18a and 18b are set to be around 30% in the present embodiment. To obtain a sinusoidal transmittance spectrum, it is preferable for the reflectivity of both surfaces 18a and 18b from 30% to 40%.

(First Embodiment)

Figure 4A:
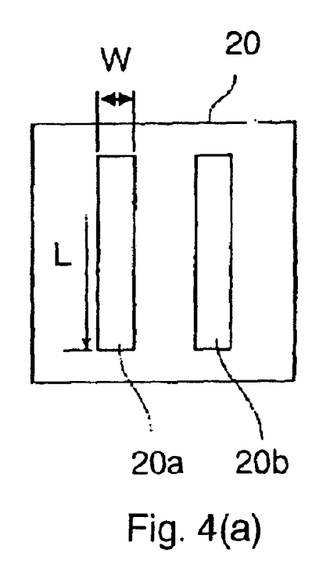
FIG. 4(a) is an elevation view of the optical detector.
Figure 4B:
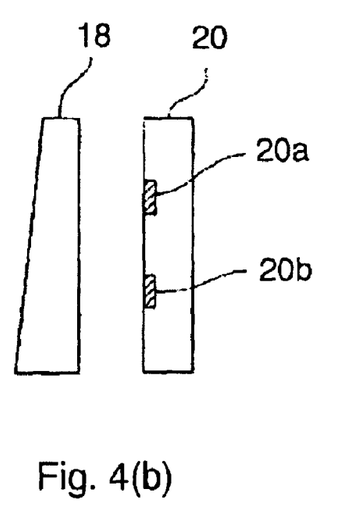
FIG. 4(b) is a plane diagram showing the combination of the detector and the Etalon device.
Figure 4C:
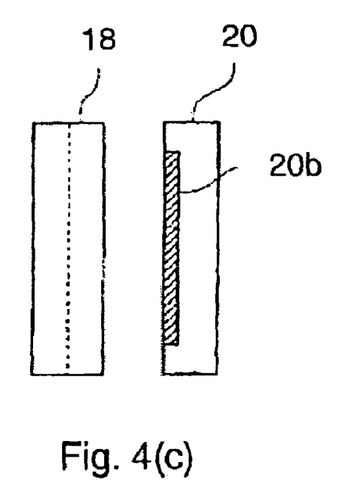
FIG. 4(c) is a side diagram showing the detector and the Etalon.

FIG. 4(a) shows a typical configuration of the light detector 20a and 20b. Respective detectors 20a, 20b are arranged in parallel with each other. The length L along the vertical direction is greater than the width along the transverse direction. This arrangement is quite suitable when the light-receiving device 20 is combined with the Etalon 18. In the Etalon, the magnitude of the transmitted light varies along the inclined direction. Therefore, the monochromatic performance of the detected light will be enhanced, as the width of the light detector is narrower and the output signal from the light detector 20a, 20b will change sharply. The magnitude of the output signal decreases, as the width of the detector is narrow. On the other hand, The variation of the optical magnitude does not occur along the direction normal to the inclined direction of the Etalon 18. Therefore, the configuration of the respective light detector, the length of which is greater than the width of it, is quite suitable for the combination to the Etalon 18. FIG. 4(a) and FIG. 4(b) show the combination of the Etalon 18 and the light detector 20a and 20b. In the figure, although the shapes of respective detector are rectangle, it will be easily understood for the ordinal person that an ellipsoid with the major axis being arranged vertically will be also applicable for the light detector. The light detector 20a and 20b are PIN-PD formed on an InP substrate with InGaAs as a window material.

(Second Embodiment)

Figure 5A:
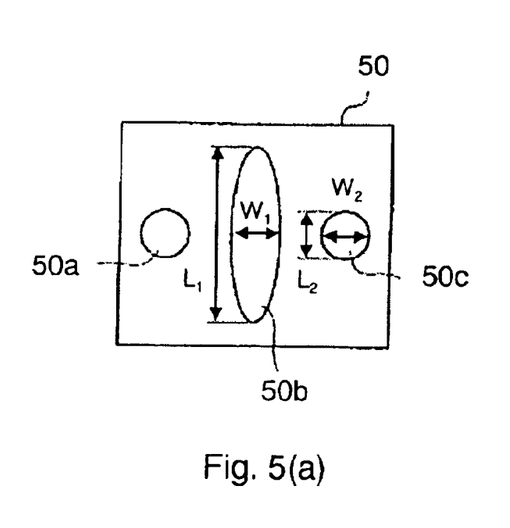
FIG. 5(a) is a front view showing the case including another optical detector.
Figure 5B:
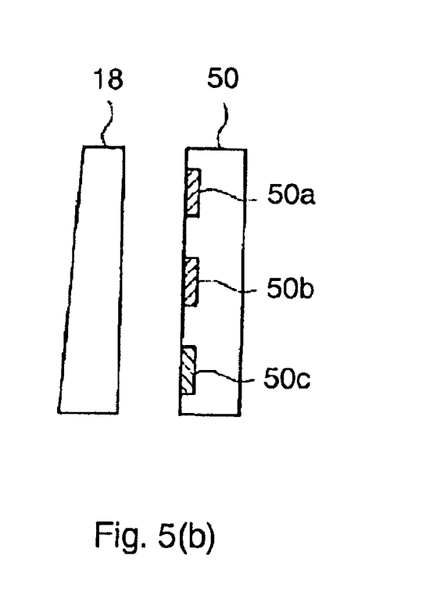
FIG. 5(b) is a plane diagram showing the combination of the detector of FIG. 5(a) and the Etalon device.
Figure 5C:
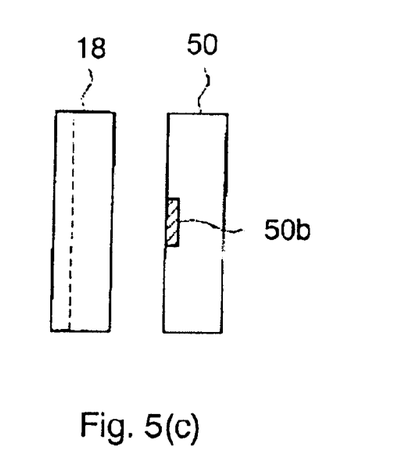
FIG. 5(c) is a side diagram of the first detector and the Etalon.
Figure 5D:
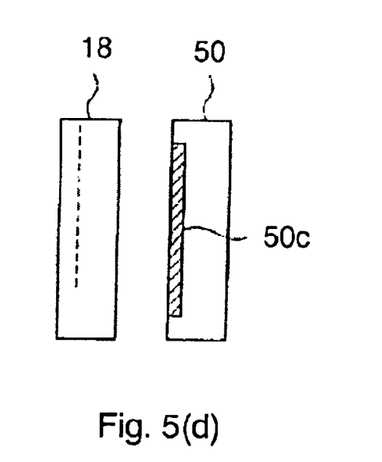
FIG. 5(d) is a side diagram of the second detector and the Etalon.

FIG. 5(a) shows another configuration of the light detector. The light detectors (50a, 50b, 50c) are arranged in line on the light-receiving device 50. The shape of the detector 50b is an ellipsoid with a major axis being along the vertical direction. The length $L_1$, which corresponds to the major axis, is greater than the width $W_1$. Detectors 50a and 50c have a similar shape of an ellipsoid; the length $W_2$ of the major axis is comparable to that of the minor axis $L_2$. To sum up the output from the detector 50a and the detector 50b improves the sensitivity of the detector.

Figure 6A:
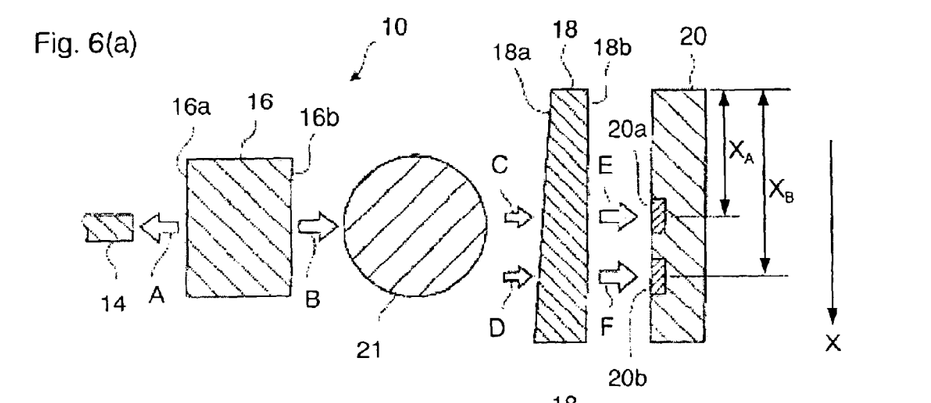
FIG. 6 shows arrangements of the laser, the lens, the Etalon and a plurality of detectors.
Figure 6B:
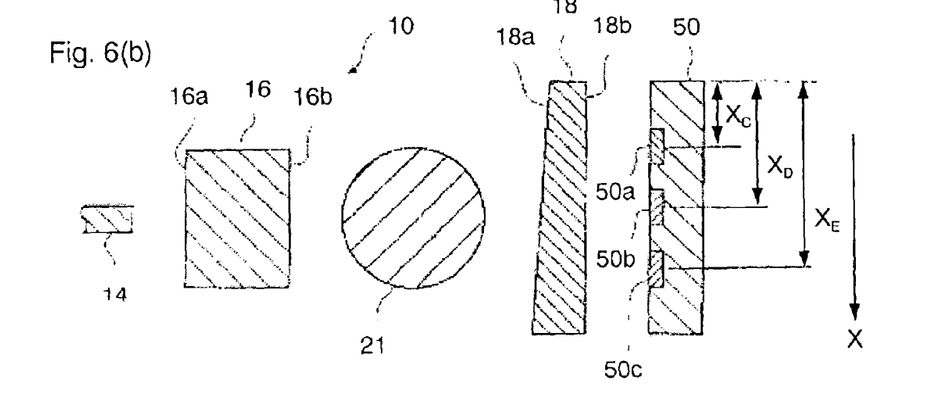

FIG. 6 shows relative position of the laser 16, the spherical lens 21, the wedge Etalon 18, and the photo light-receiving device 20 of the first embodiment. FIG. 6(*b*) shows the similar arrangement for the light-receiving device 50 of the second embodiment.

The spherical lens 21 converts a divergent light B emitted from the facet 16b of the laser 16 into a collimated light (C, D). The collimated light (C, D) respectively enter the first portion with a thickness $d_1$ and the second portion with a thickness $d_2$ of the wedge Etalon 18. By the multiple interference in the Etalon, the light (E, F) emitted from the Etalon show a specific wavelength spectrum depending on the thickness of the Etalon.

Since the Etalon shown in FIG. 6 is the wedge type, the thickness at the first portion and the second portion changes by sliding the Etalon. This causes the variation of the transmittance.

Figure 7:
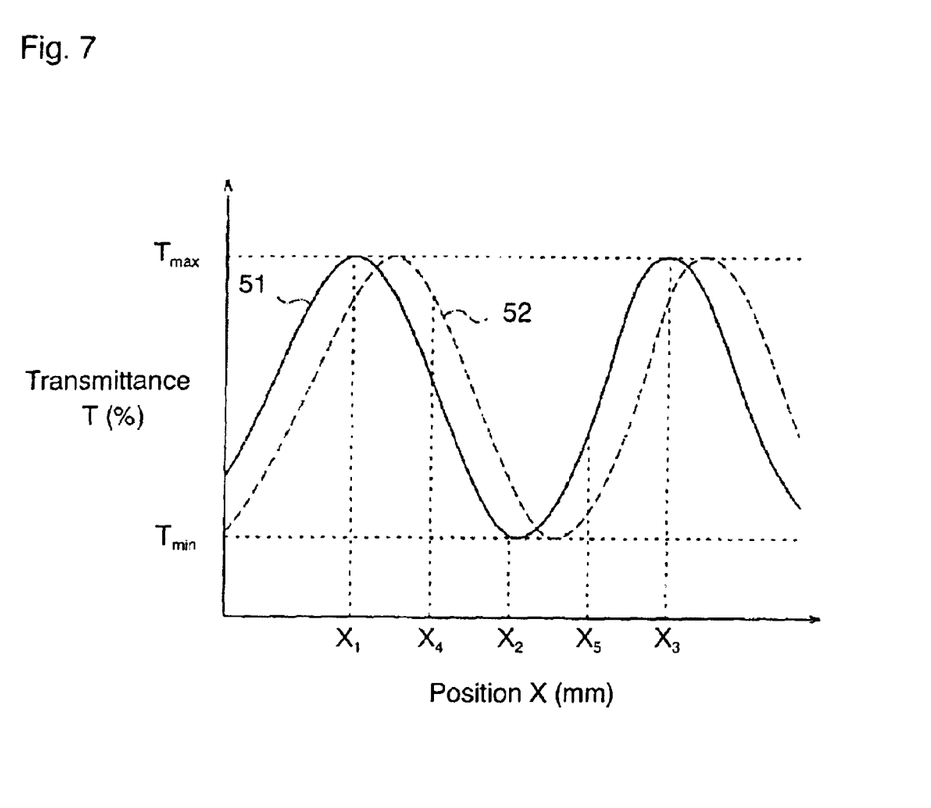
FIG. 7 is a graph showing the transmittance of the Etalon.

As shown in FIG. 7, the transmittance of the Etalon 18 varies periodically as the position X changes. The curve 51 in FIG. 7 corresponds to the transmittance for the wavelength λ, which has a relative maximum $T_{max}$ at the position $X_1$ and $X_3$, and a relative minimum $T_{min}$ at the $X_2$. Changing the wavelength of the light to λ+Δλ, the transmittance shifts to the curve 52. The entire behavior of the curve 51 and 52 are almost same, only the phase of them are slightly shifted. The decrease of the transmittance at $X_1$ by the wavelength change □λ is comparable to the increase of the transmittance at $X_2$, and this increase or decrease of the transmittance is smaller than the change at other positions, such as $X_4$ and $X_5$. Namely, positions ($X_1$, $X_2$, $X_3$) where the transmittance shows relative maximum or relative minimum are positions where the variation of the transmittance to the wavelength is relatively small. The increase of the transmittance T at the $X_4$ between $X_1$ and $X_2$ is almost equal to the decrease at $X_5$ between $X_2$ and $X_3$. Moreover, the magnitude of the increase or the decrease is greater than that measured at other position.

From characteristics of the Etalon, the position of light detectors 20a and 20b are determined as follows: the position $X_A$ of the first detector 20a corresponds to $X_1$ in FIG. 7 and the position $X_B$ of the second detector 20b is to $X_4$. This means that the first detector 20a is arranged at the position where the wavelength dependence of the transmitting light is small, while the second detector 20b is placed at the position where the wavelength dependence of the light is large. In another words, the location of the first detector 20a shows relatively small variation for the geometrical change, while that of the second detector 20b shows large dependence on the wavelength deviation. In the present invention, the detector 20a is used for the optical output power monitor and the second detector 20b is for the wavelength monitor. The signal corresponding to the optical power is sent from the first detector to the control circuit and the control circuit adjusts the optical output power of the laser 16 based on this signal. The temperature of the thermoelectric cooler 34 is controlled by the signal from the second detector 20b, thus adjusts the oscillation wavelength of the laser 16.

The light-receiving device 20 is replaced to the diode chip 50 in FIG. 6(*b*). The position of the chip 50 is arranged so as that the $X_C$ corresponds to $X_1$, $X_D$ to $X_4$, and $X_E$ to $X_3$ in FIG. 7, respectively. By this arrangement, detectors 50a and 50c locate where the geometrical variation of the transmitting light is small, while the detector 50b locates where the variation is relatively large. In the present embodiment, detectors 50a and 50c are used for monitoring the optical power of the laser, and the detector 50b detects the oscillation wavelength of the laser 16.

As shown in FIG. 5, the ellipsoidal form with the vertical major axis of the detector 50b enables to enhance the sensitivity for the wavelength, moreover this detector is arranged in the position where relatively large variation for the wavelength deviation is appeared. To increase the optical sensitivity, the ellipsoid with the vertical major axis is applied.

Detectors 50a and 50c positions apart by about half period of the periodic curve of the transmittance shown in FIG. 7 to compensate the increase/decrease of the detected light. As shown in FIG. 7, the magnitude of the transmitting light at $X_1$ increases as the wavelength deviation by □λ, while the light at $X_2$ apart from $X_1$ by a quarter period of the curve 51 decrease as the wavelength variation. Thus, detectors 50a and 5c compensate their output power with each other, which is effective for monitoring the optical output power from the laser 16.

Figure 6C:
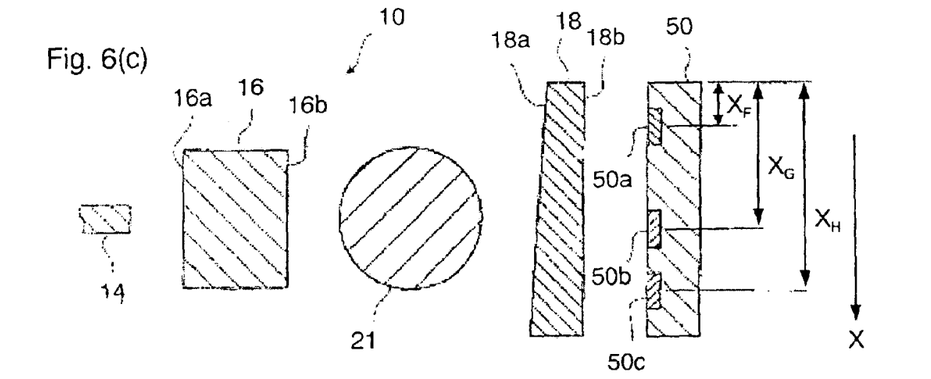

In FIG. 6(*c*), the detector 50a, 50b and 50c position at $X_1$, $X_5$, and $X_3$ in FIG. 7, respectively. By this arrangement, detectors 50a and 50c locates in the position where the wavelength variation of the transmittance of the Etalon 18 is small and the detector 50b locates at the position where the variation is large.

(Third Embodiment)

From FIG. 8(*a*) to FIG. 8(*d*) show another embodiment of the present invention. Detectors 60a and 60b are arranged on the light-receiving device 60. The shape of first detector is an ellipsoid with the major axis $W_3$ and the minor axis $L_3$. The second detector 60b is also an ellipsoid with the major axis $L_4$ and the minor axis $W_4$. The width $W_3$ is longer than $W_4$, while $L_3$ of is shorter than $L_4$. Detectors 60a and 60b may be PIN-PD formed on an InP substrate and has an optical window made of InGaAs.

Figure 8A:
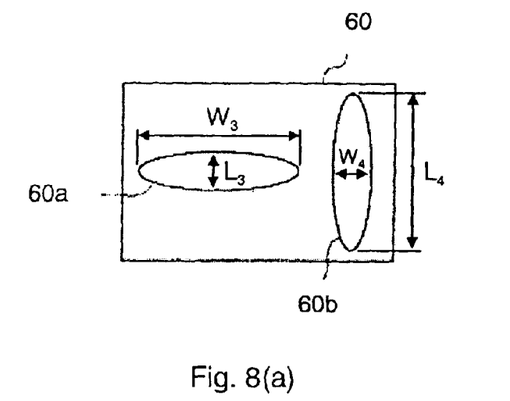
FIG. 8(a) is a front view of the third embodiment of the detector.
Figure 8B:
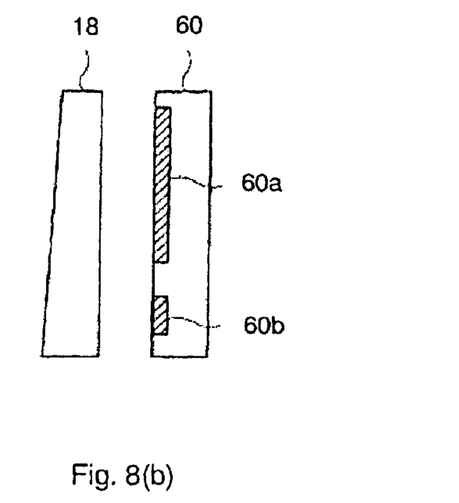
FIG. 8(b) is a plane diagram of the combination of the Etalon and the detector shown in FIG. 8(a), and FIG. 8(c) and FIG. 8(d) show a side diagram of the detector in FIG. 8(a) and the Etalon.
Figure 8C:
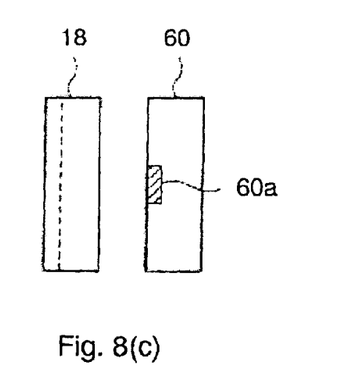
Figure 8D:
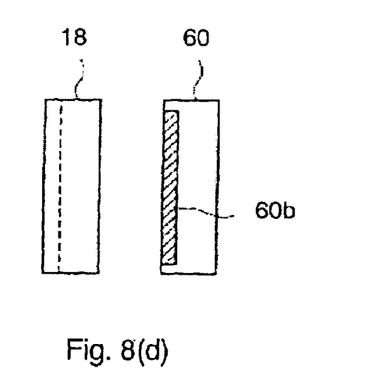

The detector 60a, the ellipsoid of which is extended horizontally, is preferable for monitoring the optical power of light transmitting through the Etalon. Since two surfaces of the Etalon makes a little angle, the magnitude of transmitting light varies horizontally along the inclined direction. The wavelength dependence of light must be reduced for monitoring and the controlling the optical power of the laser 16. Therefore, to extend the major axis $W_3$ of the ellipsoid effectively cancels the wavelength dependence of the detector 60a. In the case that $W_3$ may be multiples of the half period appeared in the transmission spectrum of the Etalon, the detector 60a integrates the whole output for one period. Hence, the wavelength dependence is further eliminated. From 90% to 110% of the period is preferable for the width $W_3$.

The monochromatic performance of light will be enhanced, as the width $W_4$ of the detector is narrow, and the output signal from the detector 60b change sharply. However, the magnitude of the output signal decreases, as the width of the detector is narrow. Therefore, the configuration of the detector 60b, the vertical length $L_4$ is greater than the width $W_4$, is quite effective for compensating the decrease of the signal. It is preferable that $W_4$ is smaller than a half period of the transmission spectrum of the Etalon. Shorter than 30% of the period is quite preferable.

FIG. 8(*b*) is the horizontal view showing the Etalon 18 and detectors (60a, 60b), FIG. 8(*c*) is the side view of the detector 60a, and FIG. 8(*d*) is the side view of the detector 60b. Although both detectors have an ellipsoid in the present embodiment, it will be understood for an ordinal person that to set a rectangle with longer side corresponding to $W_3$ or $L_4$ gives a same function.

Figure 9:
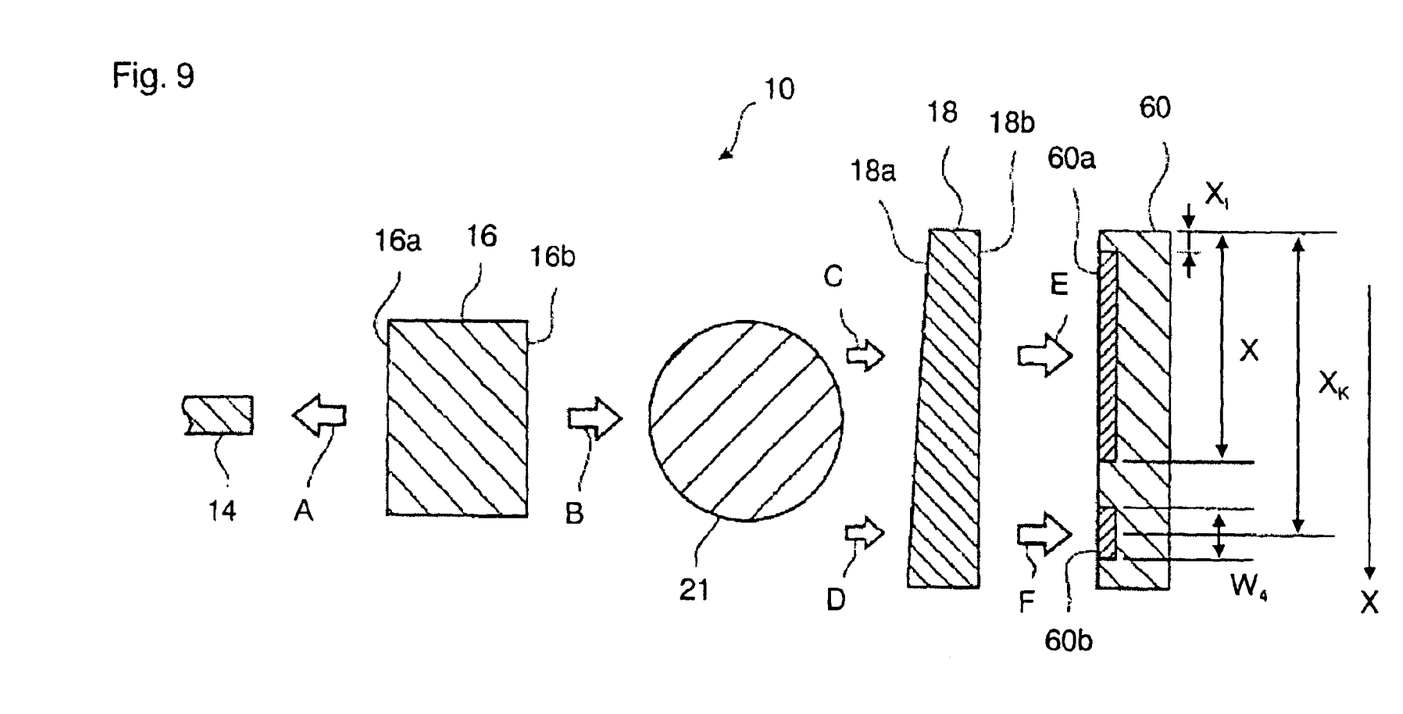
FIG. 9 shows an arrangement of the semiconductor device, the lens, the Etalon and the detector.

FIG. 9 shows the arrangement of the Etalon, the lens 21, and detectors (60a, 60b). Light B emitted from the laser 16 is converted by the lens 21 into a collimated light (C, D) and guided to the Etalon 18. By the multiple interference in the Etalon 18, the light (E, F) transmitted through the Etalon 18 show a specific wavelength dependence on the thickness of the Etalon.

Figure 10:
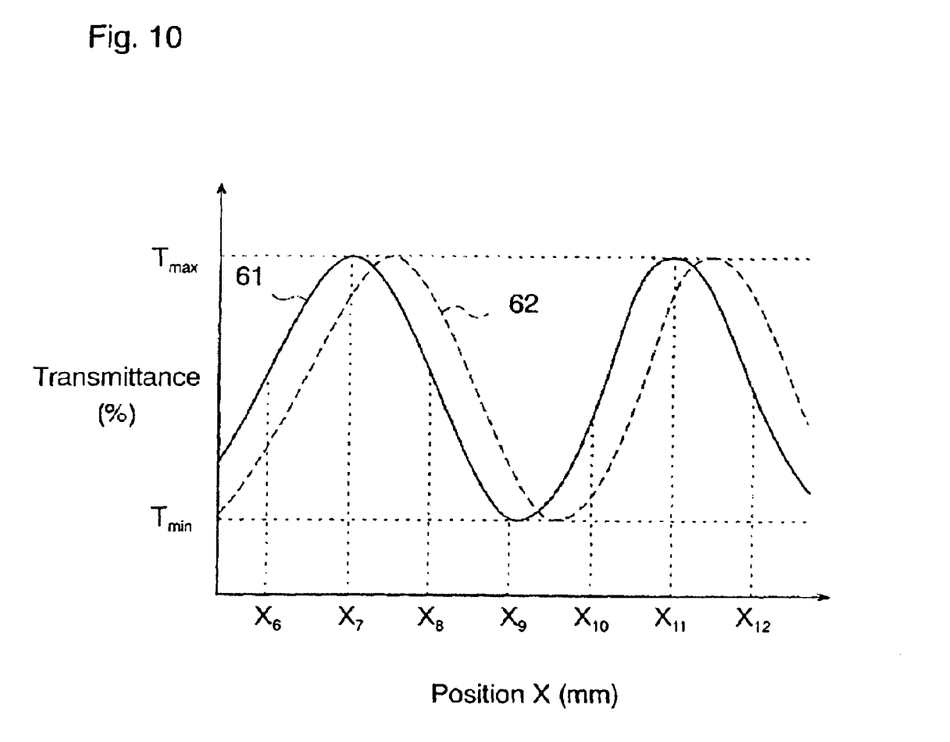
FIG. 10 is a transmittance of the Etalon combined with the detector in FIG. 9.

Similar to FIG. 7, the relation of the transmittance of the Etalon 18 at any horizontal position X is shown in FIG. 10. The periodical curve 61 gives the transmittance of the Etalon 18 at wavelength $\lambda$, which appears relatively maximum $T_{max}$ at $X_7$ and $X_{11}$ and relatively minimum $T_{min}$ at $X_9$. The specific curve 62 is for the wavelength of $\lambda+\Delta\lambda$, which traces the curve 61 but slightly shifts the phase.

Based on the characteristic of the transmittance of the Etalon, the arrangement of the present detectors (60a, 60b) is as follows. The left edge $X_I$ and the right edge $X_J$ of the detector 60a are equal to $X_6$ and $X_{10}$ in FIG. 10, respectively, and the center $X_K$ of the detector 60b corresponds to $X_{12}$. The width $W_4$ of the detector 60b is smaller than $X_9-X_7$. In other words, the detector 60a covers a full period of the specific curve 61 in FIG. 10, while the detector 60b is arranged in the region where the wavelength variation of the transmittance of the Etalon is large. Further, the width of the detector 60b is shorter than a quarter period of the specific curve 61 in FIG. 10.

To arrange the detector for the wavelength monitoring in the position where large variation appears enables accurate control of the oscillation wavelength of the laser. On the other hand, to widen the width of the detector along the horizontal direction and to cover the full period of the specific curve brings an insensitive detection to the wavelength variation.

(Fourth embodiment)

Figures 11A, 11B, 11C:
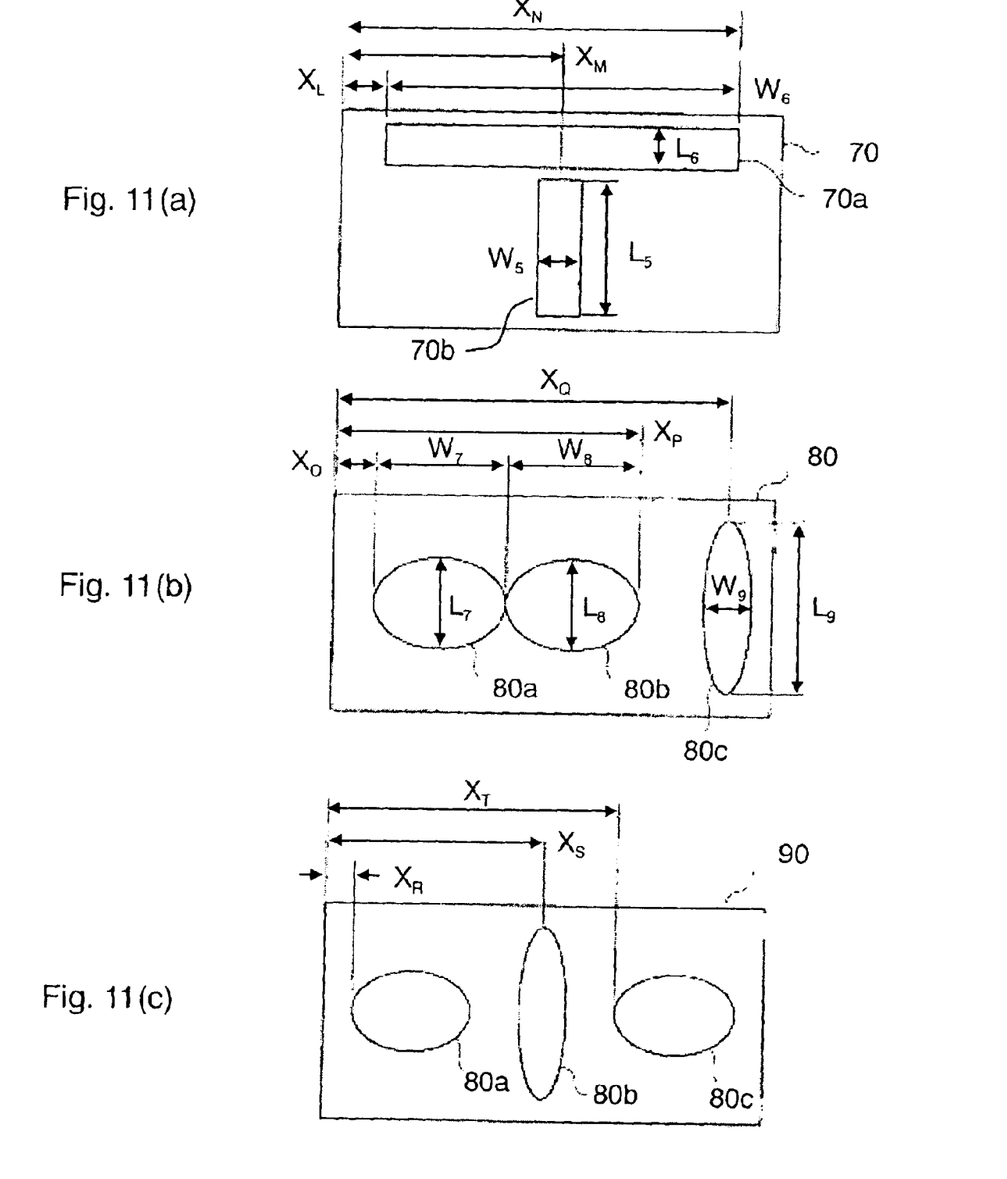
FIG. 11 shows various geometrical configurations of the detector in FIG. 8.

Another embodiments are shown in FIG. 11. The light-receiving device 70 in FIG. 11(a) contains two detectors 70a and 70b. The detector 70a is arranged along the upper edge, while the other detector 70b is below the detector 70a. The left edge $X_L$ and the right edge $X_N$ of the detector 70a corresponds to $X_6$ and $X_{10}$ in FIG. 10, respectively. The center $X_M$ of the detector 70b is equal to $X_8$. The width $W_5$ of the detector 70a is smaller than $X_9-X_7$, which is a quarter period of the specific curve in FIG. 10. This configuration brings the similar effect to FIG. 9.

The light-receiving device 80 shown in FIG. 11(b) contains three detectors (80a, 80b, 80c). The ellipsoid of the detector 80a and 80b are the same with each other, the major axis of the ellipsoid is horizontal and the minor axis is vertical. The detector 80c is also an ellipsoid but the major axis $L_9$ is vertical and the minor axis $W_9$ is horizontal.

Two detectors 80a and 80b are arranged side by side with each other. The left edge $X_O$ of the detector 80a corresponds to $X_6$, the right edge $X_P$ of the detector 80b corresponds $X_{10}$ in FIG. 10. To add electrical output from both detectors (80a, 80b) is equivalent to integrate by one period of the specific curve in FIG. 10. The center $X_Q$ of the detector 80c corresponds to $X_{12}$ and the width $W_9$ is smaller than $X_9-X_7$, which is a quarter period of the curve.

The light-receiving device 90 in FIG. 11(c) rearranges respective detectors (80a, 80b, 80c) in FIG. 11(b). The left edge $X_R$ of the detector 80a corresponds to $X_6$, the left edge $X_T$ of the detector 80b corresponds to $X_{12}$. Since the width of both detectors is almost equal to the half period of the specific curve, to add respective output from detectors is equivalent to integrate by one period of the curve. The center $X_S$ of the detector 80c is equal to $X_{10}$ in FIG. 10. This configuration shows the same function as the case of FIG. 9.

This embodiment contains two detectors (80a, 80b) for the optical power monitoring. It may be understood that the further partitioning of the detector brings the same function as the case explained hereinbefore. Moreover, although embodiments described contain a light-receiving device in which a plurality of detectors is integrated, detectors independently setting up bring similar results.

Next will explain an outline of the manufacturing of the primary assembly 10 of the module 1a. First, the first auxiliary member 24 is installed within the package 12, to which the lens 38a and the isolator 40 are assembled in advance. The second auxiliary member 26 is placed on the first member 24. Next, the lens 21 and the semiconductor laser 16 are temporarily attached on the second auxiliary member 26. After the attachment, the optical alignment between the lens 21 and the laser 16 is adjusted by monitoring the transmitted light through the lens 21.

Next, the third auxiliary member 28, the photo diode containing two detectors 20a and 20b is assembled thereon, is put on the first member 24. The position of the third member 28 is adjusted so as to balance respective output from both detectors (20a, 20b). Finally, the wedge Etalon 18 is placed between the lens 21 and two detectors (20a, 20b) and is adjusted its position. The angle between two surfaces of the Etalon 18 and the interval of both detectors are designed to be optimum, therefore, the position of the Etalon is adjusted so as that the output of the first detector gives relatively maximum.

We claim:

1. An light-emitting module comprising:
   a) a semiconductor light-emitting device oscillating at wavelength $\lambda$;
   b) a first optical detector for monitoring an optical output of said semiconductor device;
   c) a second optical detector for monitoring said optical output of said semiconductor device; and
   d) an Etalon device having a first surface receiving said output of said semiconductor device and a second surface for optically coupling said first detector and said second detector, said first surface being inclined to said second surface so as to make an transmittance having a predetermined period along a first direction, said Etalon device having a first portion including a first optical axis connecting said semiconductor device to said first detector and a second portion including a second optical axis connecting said semiconductor device to said second detector.

2. The light-emitting module according to the claim 1, wherein a width of said second detector is narrower than a quarter of said period along said first direction.

3. The light-emitting module according to the claim 2, wherein a wavelength dependence of said transmittance of said first portion of said Etalon device at said wavelength $\lambda$ is smaller than a wavelength dependence of said transmittance of said second portion of said Etalon device at said wavelength $\lambda$.

4. The light-emitting module according to the claim 3, wherein an interval between said first detector and said second detector is a quarter of said period.

5. The light-emitting module according to the claim 3, further comprising a third optical detector, said Etalon device further having a third portion including a third optical axis connecting said semiconductor device to said third detector,
   wherein a wavelength dependence of said transmittance of said third portion of said Etalon device at said wavelength λ is smaller than a wavelength dependence of said transmittance of said second portion of said Etalon device at said wavelength λ.

6. The light-emitting module according to the claim 5, wherein said third detector is apart from said first detector by half of said period, and said second detector is apart from said first detector by a quarter of said period.

7. The light-emitting module according to the claim 6, further comprising a means for adding an output from said first detector to an output from said third detector.

8. The light-emitting module according to the claim 5, wherein said third detector is apart from said first detector by said period and said second detector is apart from one of said first detector and said third detector by a quarter of said period.

9. The light-emitting module according to the claim 8, further comprising a means for adding an output from said first detector to an output from said third detector.

10. The light-emitting module according to the claim 3, wherein a width of said first detector is wider than a half of said period along said first direction.

11. The light-emitting module according to the claim 10, wherein a wavelength dependence of said transmittance of said second portion of said Etalon device at said wavelength λ has a relative maximum.

12. The light-emitting module according to the claim 2, further comprising a third optical detector, a sum of a width of said first detector and a width of said third detector is wider than a half of said period along said first direction.

13. The light-emitting module according to the claim 12, wherein a wavelength dependence of said transmittance of said second portion of said Etalon device at said wavelength λ has a relative maximum.

14. The light-emitting module according to the claim 12, wherein said first detector and said third detector sandwiches said second detector therebetween.

15. The light-emitting module according to the claim 12, further comprising a means for adding an output from said first detector to an output from said third detector.

16. The light-emitting module according to the claim 1, wherein said first detector and said second detector are integrally formed on a semiconductor.

17. An optical module comprising:
a) a light emitting semiconductor device having a first facet and a second facet opposing said first facet, said semiconductor device oscillating at a wavelength λ;
b) a lens optically coupled to said second facet of said semiconductor device;
c) a first optical detector for monitoring an optical output of said semiconductor device and outputting a first output;
d) a second optical detector for monitoring said optical output of said semiconductor device and outputting an second output;
e) a wedge Etalon device having a first surface for optically coupling said lens and a second surface for optically coupling said first detector and said second detector, said first surface being inclined to said second surface so as to make an transmittance having a predetermined period along a first direction, said Etalon device having a first portion including a first optical axis connecting said semiconductor device to said first detector and a second portion including a second optical axis connecting said semiconductor device to said second detector; and
f) a thermoelectric cooler for controlling a temperature of said semiconductor device;

wherein a width of said second detector is narrower than a half of said period along said first direction, a wavelength dependence of said first portion being less than a wavelength dependence of said second portion at said wavelength λ, and wherein said oscillation wavelength λ of said semiconductor device is controlled through said temperature of said thermoelectric cooler by said second output of said second detector.

18. An optical module comprising:
a) a light emitting semiconductor device having a first facet and a second facet opposing to said first facet, said semiconductor device outputting an optical output at a wavelength λ;
b) a lens optically coupled to said second facet of said semiconductor device;
c) a first optical detector for monitoring an optical output of said semiconductor device and outputting a first output, said first detector having a first width along a predetermined direction;
d) a second optical detector for monitoring said optical output of said semiconductor device and outputting an second output, said second detector having a second width along said direction;
e) a wedge Etalon device having a first surface for optically coupling said lens and a second surface for optically coupling said first detector and said second detector, said first surface being inclined to said second surface so as to make an transmittance having a predetermined period along said direction, said Etalon device having a first portion including a first optical axis connecting said semiconductor device to said first detector and a second portion including a second optical axis connecting said semiconductor device to said second detector, said first portion having a first wavelength dependence of said transmittance at said wavelength λ and said second portion having a second wavelength dependence of said transmittance at said wavelength λ; and
f) a thermoelectric cooler for controlling a temperature of said semiconductor device;

wherein said first width of said first detector is wider than said period along said direction, and said output of said semiconductor device is controlled by said first output of said second detector.

* * * * *